(12) United States Patent
Chi et al.

(10) Patent No.: US 8,319,337 B2
(45) Date of Patent: Nov. 27, 2012

(54) CONDUCTIVE STRUCTURE FOR A SEMICONDUCTOR INTEGRATED CIRCUIT AND METHOD FOR FORMING THE SAME

(75) Inventors: Chung-Pang Chi, Sinshih Township, Tainan County (TW); Cheng Tang Huang, Sinshih Township, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 377 days.

(21) Appl. No.: 11/898,612

(22) Filed: Sep. 13, 2007

(65) Prior Publication Data

US 2008/0197467 A1    Aug. 21, 2008

(30) Foreign Application Priority Data

Feb. 15, 2007  (TW) ................. 96105681 A

(51) Int. Cl.
  *H01L 23/48*  (2006.01)
(52) U.S. Cl. . 257/737; 257/637; 257/738; 257/E23.021; 257/E23.033
(58) Field of Classification Search .................. 257/673, 257/737, 738, E23.021, E23.033
See application file for complete search history.

(56) References Cited

U.S. PATENT DOCUMENTS

| | | | | |
|---|---|---|---|---|
| 5,171,711 | A * | 12/1992 | Tobimatsu .................... | 438/614 |
| 6,077,726 | A * | 6/2000 | Mistry et al. .................. | 438/108 |
| 6,230,400 | B1 * | 5/2001 | Tzanavaras et al. ............ | 29/840 |
| 6,448,171 | B1 * | 9/2002 | Wang et al. .................... | 438/614 |
| 7,041,589 | B2 * | 5/2006 | Lay et al. ....................... | 438/613 |
| 7,323,780 | B2 * | 1/2008 | Daubenspeck et al. ........ | 257/738 |

\* cited by examiner

*Primary Examiner* — Robert Huber
(74) *Attorney, Agent, or Firm* — Muncy, Geissler, Olds & Lowe, PLLC

(57) ABSTRACT

A conductive structure for a semiconductor integrated circuit and method for forming the conductive structure are provided. The semiconductor integrated circuit has a pad and a passivation layer partially covering the pad to define a first opening portion having a first lateral size. The conductive structure electrically connects to the pad via the first opening portion. The conductive structure comprises a support layer defining a second opening portion. A conductor is formed in the second opening portion to serve as a bump having a planar top surface.

6 Claims, 4 Drawing Sheets

CONDUCTIVE STRUCTURE FOR A SEMICONDUCTOR INTEGRATED CIRCUIT AND METHOD FOR FORMING THE SAME

This application claims priority to Taiwan Patent Application No. 096105681 filed on Feb. 15, 2007, the disclosures of which are incorporated herein by reference in their entirety.

CROSS-REFERENCES TO RELATED APPLICATIONS

Not applicable.

BACKGROUND OF THE INVENTION

1. Field of the Invention

The present invention relates to a semiconductor structure. More particularly, the present invention relates to a semiconductor structure having a flattened surface and a method for forming the same.

2. Descriptions of the Related Art

Bump electroplating techniques are used in microelectronics and micro system fields, such as in connections between flat panel displays (FPD) and drivers IC, in conductive lines and air bridges techniques in GaAs chips, and in the manufacturing of X-ray masks in LIGA techniques. The aforementioned techniques apply bump electroplating techniques at different stages throughout the manufacturing process.

For example, in a IC chip and circuit board setup, the IC chip is connected to the circuit board in many available ways, and the main packaging method is related to the gold bump electroplating technique. The pad of the IC chip is thereby electrically connected to the circuit board by the use of this technique. The aforementioned techniques not only greatly shrink dimensions of the chip, but also affix the chip on the circuit board, thus reducing the size, decreasing the sensitivity, and improving heat dissipation of the chip and the circuit board. Additionally, electroplating techniques are low cost, an obvious benefit in the development and manufacturing of these chips.

A typical bump electroplating process, such as a gold bump electroplating process, requires forming an under bump metal (UBM) on the pad first. The UBM is applied as an adhesion layer between the bump and the pad, as well as connected to a conductive layer that is jointly used as media during electroplating. The conductive layer is substantially formed either simultaneously with, or separately from, the UBM. Meanwhile, the conductive layer and the UBM may be formed by the same process and made of the same materials. Therefore, the bump can be formed successfully on the UBM and be electrically connected to the pad via the UBM. Before the electroplating process, a plurality of conductive layers, or conductive UBM, are formed on the surface of the chip, except the pad. After the bump is formed in the electroplating process, the conductive layers or UBM are then removed by etching.

The bump is larger in lateral dimension than the pad so that after the electroplating process, the bottom of the bump provides sufficient support when the bump is being connected to the circuit board, thus preventing cracks or deformations from compression. Referring to FIG. 1, the UBM 12 is naturally formed with two corner portions 12a when the UBM 12 is formed on the opening portion defined by the pad 13 and the passivation layer 14. When the bump 10 is isotropically accumulated along the upward direction from the UBM 12, for example by the electroplating process, the bump 10 would naturally cover the corner portions 12a. Therefore, the top surface 11 of the bump 10 would be rugged due to the rugged surface of the UBM 12 and present jutting corners 101 and 102.

The aforementioned jutting corners 101 and 102 can cause contacting surface damage or a bad connection when the bump 10 is being connected to the circuit board and can result bad electric conductivity. Therefore, extra processes such as polishing are needed to eliminate the jutting corners. The extra processes are not convenient and are difficult during the stages of quality control.

Further, since the surface of the chip may be rugged, the UBM may suffer break point and hinder electric conductivity when the UBM is formed on the surface of the chip. Additionally, the UBM may be not uniform in thickness, thus resulting in increased electric resistance of the UBM. To solve the aforementioned issues, prior arts are provided with a thicker UBM. However a thicker UBM would have higher resistance. Since the main objective of the UBM is to be the adhesion layer between the bump and the pad, and the UBM naturally has higher resistance compared to the pad and bump, a thicker UBM will result in a significant increase in electric resistance between the bump and the pad, thus harming electric conductivity between the chip and the circuit board. The aforementioned situations influence the electroplating process and decrease the yield of electroplating the bump, resulting in either the need for post-processing procedures, or an unusable chip altogether.

Accordingly, a solution of providing a conductive structure for a semiconductor integrated circuit is highly desired in semiconductor technology.

SUMMARY OF THE INVENTION

The primary objective of this invention is to provide a conductive structure for a semiconductor integrated circuit. The semiconductor integrated circuit comprises a pad and a passivation layer that partially covers the pad to define a first opening portion. The conductive structure is then adapted to electrically connect with the pad through the first opening portion. The conductive structure comprises a supporting layer with a second opening portion in which a conductor with a flattened top surface is formed as a bump.

Another objective of this invention is to provide a conductive structure for a semiconductor integrated circuit. The semiconductor integrated circuit comprises a pad and a passivation layer. The conductive structure is configured to ensure no brake point on the passivation layer and ensure a conductive layer with steady resistance.

To achieve the aforementioned objective, the present invention discloses a conductive structure comprising a supporting layer and a conductor. The supporting layer covers the edge of the first opening portion and defines a second opening portion with a second lateral dimension. The conductor is formed in the second opening portion. The second lateral dimension is not substantially larger than the first lateral dimension.

The present invention further discloses a method for forming the aforementioned conductive structure for a semiconductor integrated circuit, in which the semiconductor integrated circuit comprises a pad and a passivation layer partially covering the pad to define a first opening portion with a first lateral dimension. The aforementioned method comprises the following steps of: (a) forming a supporting layer to define a second opening portion with a second lateral dimension, in which the second lateral dimension is not substantially larger than the first lateral dimension: (b) forming a conductor in the second opening portion, in which the conductor is adapted to electrically connect with the pad through the first opening portion.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

FIG. 2(a) to FIG. 2(e) collectively illustrate the preferred embodiment of the present invention, in which the manufacture process of a semiconductor integrated circuit 20 is shown.

Figure 1:
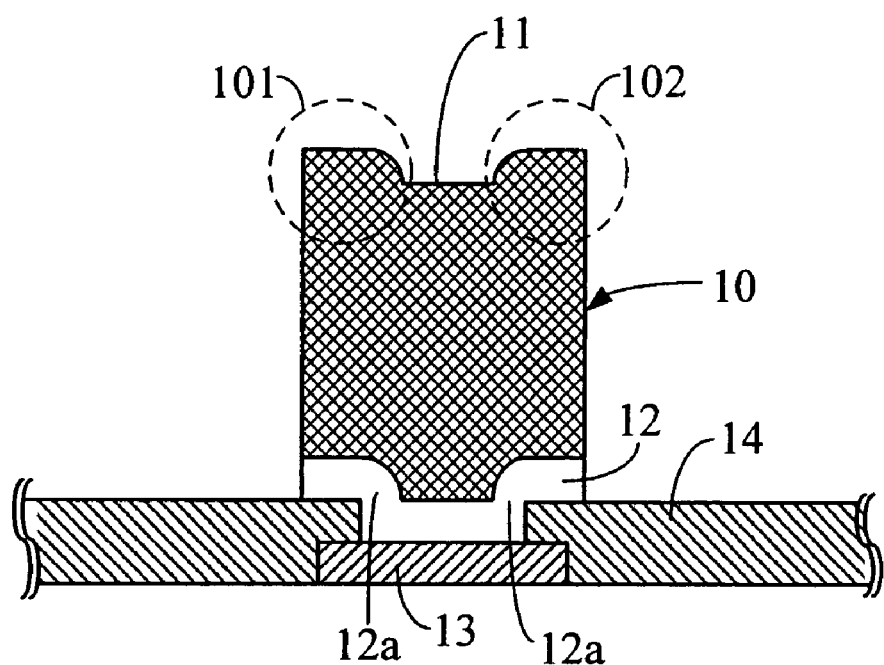
FIG. 1 is a profile diagram of a semiconductor integrated circuit of the prior art.
Figure 2A:
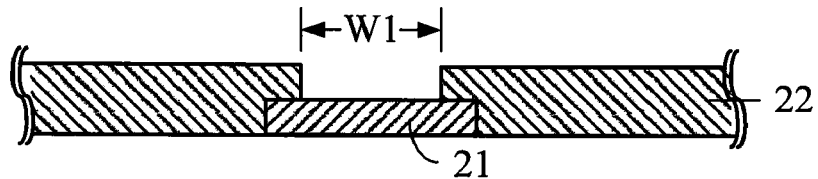
FIGS. 2(a)-2(e) show process flow, as well as structure diagrams, of a preferred embodiment of the present invention.

First, as shown in FIG. 2(a), the semiconductor integrated circuit 20 comprises a pad 21 and a protection layer 22. In the embodiment, the pad 21 is made of aluminum, and the protection layer 22 partially overlaps the pad 21 to expose a portion of the pad 21 to form a first opening portion as a contact window, and later, a bump. The first opening portion has a first lateral dimension W1. Since the protection layer 22 partially overlaps the edges of the pad 21, the lateral dimension W1 of the first opening portion is smaller than the lateral dimension of the pad 21.

Figure 2B:
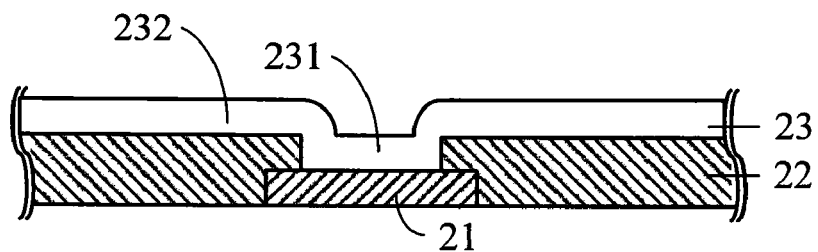
Figure 3:
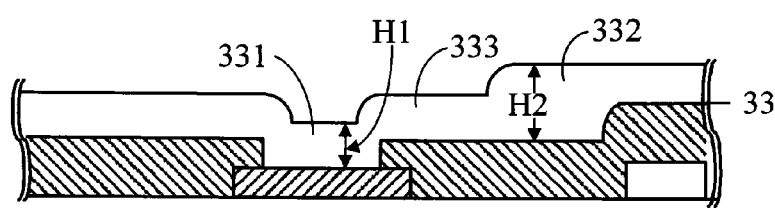
FIG. 3 is a modified embodiment of the embodiment seen in FIG. 2(b)

Then, a conductor, such as a titanium/tungsten alloy conductor 23, is formed for conducting current in the electroplate process so that the bump can be formed. In the present invention, the titanium/tungsten alloy conductor 23 comprises a central portion 231 and a periphery portion 232, wherein the central portion 231 overlaps the first opening portion, and the periphery portion 232 extends onto the protection layer 22 as shown in FIG. 2(b). The conductor can also comprise a partially thicker portion as shown in FIG. 3. In FIG. 3, the central portion comprises a first vertical dimension H1, while one portion of the periphery portion comprises a second vertical dimension H2. The second vertical dimension H2 is not smaller than the first vertical dimension H1. Detailed description of the FIG. 3 is described hereinafter.

Figure 2C:
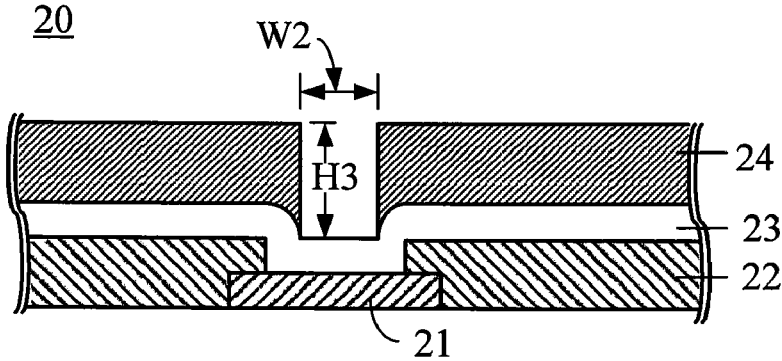

A supporting layer made of a nonconductor, such as a Polyimide (PI) layer 24, is then formed on the titanium/tungsten alloy conductor 23. The portion of the PI layer 24 that overlaps the first opening portion is cleaned by a certain method similar to etching to expose the titanium/tungsten alloy conductor 23 and to define a second opening portion with a second lateral dimension W2, as shown in FIG. 2(c). The titanium/tungsten alloy conductor 23 exposed by the second opening portion is configured to be a bottom surface for forming the bump in the electroplate process. To prevent the disadvantages induced by rugged bottom surface of the prior art, the bottom surface has to be a substantially smoother surface. Thus, the second lateral dimension is not greater than the first lateral dimension. So that the portion of the titanium/tungsten alloy conductor 23 exposed by the second opening portion has an expected smoother surface. The portion of the PI layer 24 around the second opening portion has a third vertical dimension H3. The supporting layer is made of Benzocyclobutene (BCB) materials.

Figure 2D:
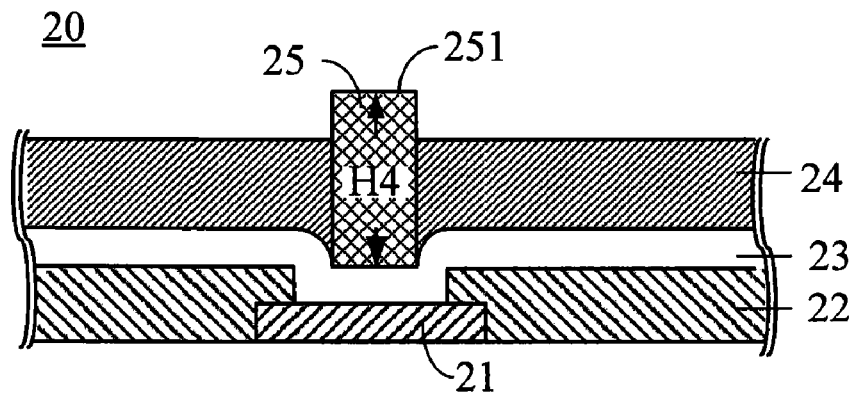

The conductor is then made in the second opening portion by the electroplate process as a bump 25. The bump 25 can be made of gold and with a fourth vertical dimension H4. Since the supporting layer is made of nonconductor, the fourth vertical dimension H4 of the bump 25 has to be continuously formed until it is larger than the third vertical dimension H3 of the supporting layer. FIG. 2(d) shows the fourth vertical dimension H4 which is greater than the third vertical dimension H3, in which the bump 25 with a flattened top surface 251 can be cleanly electrically connected to the circuitry board as shown in FIG. 2(d).

Figure 2E:
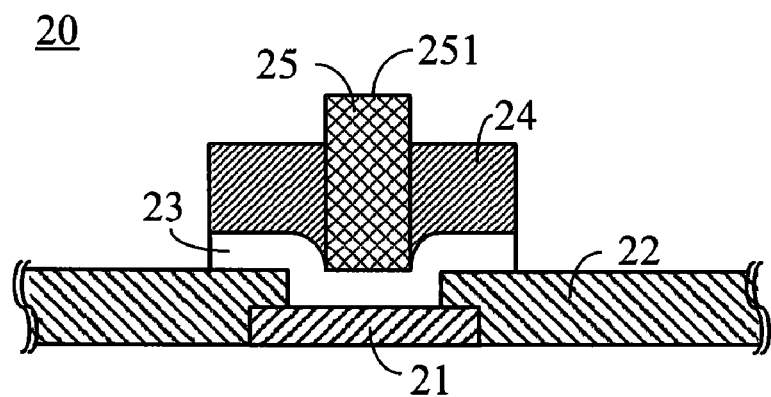

Finally, as shown in FIG. 2(e), the unnecessary parts are cleaned by a certain method similar to etching. Only the bump 25 and a specified ratio of the supporting layer 24 as well as the structure therebelow remain. It can be understood that although the bump 25 shown in FIG. 2(e) has a smaller lateral dimension compared to the prior art, the supporting layer 24 surrounding the sidewall of the bump 25 ensures that the bump 25 has a flattened top surface for a clean electrical connection as well as a more stable conductive structure.

FIG. 3 shows a modified embodiment of the present invention. The figure is a drawing of the partial manufacturing result of a semiconductor integrated circuit 30. The rest of the manufacturing processes of the present embodiment are the same as the previous embodiment, and thus the redundant details are omitted hereinafter. The conductive structure of the present embodiment comprises a titanium/tungsten alloy conductor 33 with a partially thicker portion. More particularly, the titanium/tungsten alloy conductor 33 has a central portion 331 and a periphery portion 332, wherein the central portion 331 has a first vertical dimension H1 as well as a first portion 333 of the periphery portion 332 and the second portion of the periphery portion 332 has a second vertical dimension H2. The second vertical dimension H2 is not smaller than the first vertical dimension H1. FIG. 3 shows that the second vertical dimension H2 is greater than the first vertical dimension H1.

Since the chip may have rough surface, if the titanium/tungsten alloy conductor 33 has insufficient thickness in the periphery portion 332, the titanium/tungsten alloy conductor 33 may suffer break points on the rough surface which will lead to an increased resistance or a non-uniform resistance, ultimately influencing the electroplating process. However, if the central portion 331 of the titanium/tungsten alloy conductor 33 is much thicker, the titanium/tungsten alloy results in a higher resistance, which influences the electric conductivity between the bump and the pad. Therefore a titanium/tungsten alloy conductor 33 with various thicknesses is brought up with the second vertical dimension H2 greater than the first vertical dimension H1. After the bump is formed, the second portion of the periphery portion 332 is cleaned by a certain method similar to etching. Only the first portion 333 remains. Thus the eventual conductive structure of the bump is not influenced by the thicker second portion of the periphery portion 332.

In the aforementioned embodiments, the conductor is made of under bump metal, UBM, and not limited to titanium/tungsten alloy. For example, the conductor can alternatively be made of titanium.

By the aforementioned description, it can be understood that the conductive structure of the present invention allows for a design for forming a supporting layer on the passivation layer that ensures a flattened top surface of the bump when it is formed for electrical connection to the circuitry board. Also, by forming a conductor with various thicknesses, the conductor is free from having break points in the electroplating process. Meanwhile, the portion of the conductor that connects to the pad has a thinner thickness to ensure a lower resistance between the bump and the pad.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A conductive structure of a semiconductor integrated circuit, in which the semiconductor integrated circuit has a pad, and a passivation layer partially overlapping the pad to define a first opening portion which has a first lateral dimension, the conductive structure adapted to electrically connect with the pad through the first opening portion, the conductive structure comprising:
    a supporting layer, overlapping an edge of the first opening portion, and defining a second opening portion which has a second lateral dimension substantially not greater than the first lateral dimension, wherein the supporting layer is made of an insulating material;
    a conductor, being formed in the second opening portion and having a top surface and a bottom surface; and
    a conductive layer, having a central portion and a periphery portion, wherein the central portion is substantially formed between the conductor and the pad, the periphery portion is formed around an edge of the central portion and at least partially formed between the supporting layer and the passivation layer the supporting layer having a lateral edge terminating at a lateral edge of the conductive layer;
    wherein the conductive layer is partially exposed from the second opening portion as a smooth surface, and the conductor is disposed onto the smooth surface and extends to protrude from the supporting layer within the second lateral dimension, so that the top surface of the conductor has a substantially same shape as the smooth surface of the conductive layer, and the bottom surface and the top surface of the conductor have a substantially same shape;
    wherein the conductor has uniform lateral dimensions from the top surface to the bottom surface of the conductor, and the lateral dimensions of the conductor are the same to the second lateral dimension of the second opening portion.

2. The conductive structure as claimed in claim 1, wherein the supporting layer has a third vertical dimension, and the conductor has a fourth vertical dimension, the fourth vertical dimension is substantially not smaller than the third vertical dimension.

3. The conductive structure as claimed in claim 1, wherein the conductive layer is made of titanium/tungsten alloy.

4. The conductive structure as claimed in claim 1, wherein the supporting layer is made of the insulating material selected from the group of Polyimide (PI) and Benzocyclobutene (BCB).

5. The conductive structure as claimed in claim 1, wherein the periphery portion comprises a first part and a second part, each of the central portion and the first part of the periphery portion has a first vertical dimension, and the second part of the periphery portion has a second vertical dimension, which is substantially greater than the first vertical dimension.

6. The conductive structure as claimed in claim 1, wherein the top surface of the conductor and the supporting layer fail to overlap.

* * * * *